US012628645B2

(12) United States Patent
Das Mahapatra et al.

(10) Patent No.: US 12,628,645 B2
(45) Date of Patent: *May 12, 2026

(54) CHIP-SCALE PACKAGE ARCHITECTURES CONTAINING A DIE BACK SIDE METAL AND A SOLDER THERMAL INTERFACE MATERIAL

(71) Applicant: Intel Corporation, Santa Clara, CA (US)

(72) Inventors: Susmriti Das Mahapatra, Tempe, AZ (US); Malavarayan Sankarasubramanian, Chandler, AZ (US); Shenavia Howell, Chandler, AZ (US); John Harper, Chandler, AZ (US); Mitul Modi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/744,108

(22) Filed: Jun. 14, 2024

(65) Prior Publication Data

US 2024/0332112 A1     Oct. 3, 2024

Related U.S. Application Data

(63) Continuation of application No. 17/033,080, filed on Sep. 25, 2020, now Pat. No. 12,040,246.

(51) Int. Cl.
H01L 23/36 (2006.01)
H01L 21/48 (2006.01)
(Continued)

(52) U.S. Cl.
CPC .......... H01L 23/36 (2013.01); H01L 21/4814 (2013.01); H01L 21/50 (2013.01);
(Continued)

(58) Field of Classification Search
CPC ............... H01L 23/3737; H01L 23/367; H01L 23/3736; H01L 23/42; H01L 21/50;
(Continued)

(56) References Cited

U.S. PATENT DOCUMENTS 6,724,078 B1 * 4/2004 Sur ......................... H01L 24/31
257/E23.09
11,551,994 B2 1/2023 Lofgreen et al.
(Continued)

OTHER PUBLICATIONS

Notice of Allowance from U.S. Appl. No. 17/033,080 notified Mar. 27, 2024, 8 pgs.
(Continued)

*Primary Examiner* — Alonzo Chambliss
(74) *Attorney, Agent, or Firm* — Essential Patents Group, LLP

(57) ABSTRACT

An integrated circuit (IC) package comprising a die having a front side and a back side. A solder thermal interface material (STIM) comprising a first metal is over the backside. The TIM has a thermal conductivity of not less than 40 W/mK; and a die backside material (DBM) comprising a second metal over the STIM, wherein the DBM has a CTE of not less than $18\times10^{-6}$ m/mK, wherein an interface between the STIM and the DBM comprises at least one intermetallic compound (IMC) of the first metal and the second metal.

22 Claims, 13 Drawing Sheets

(51) Int. Cl.

| | |
|---|---|
| *H01L 21/50* | (2006.01) |
| *H01L 21/768* | (2006.01) |
| *H01L 23/00* | (2006.01) |
| *H01L 23/367* | (2006.01) |
| *H01L 23/373* | (2006.01) |
| *H01L 23/42* | (2006.01) |
| *H01L 23/488* | (2006.01) |
| *H01L 21/60* | (2006.01) |

(52) U.S. Cl.
CPC ...... *H01L 21/76838* (2013.01); *H01L 23/367* (2013.01); *H01L 23/3736* (2013.01); *H01L 23/3737* (2013.01); *H01L 23/42* (2013.01); *H01L 23/488* (2013.01); *H01L 23/562* (2013.01); *H01L 2021/60135* (2013.01); *H01L 2224/73253* (2013.01)

(58) Field of Classification Search
CPC ....... H01L 21/4814; H01L 2224/16225; H01L 23/488; H01L 23/562; H01L 21/76838; H01L 2224/73253
See application file for complete search history.

(56) References Cited

U.S. PATENT DOCUMENTS

| | | | | |
|---|---|---|---|---|
| 11,682,605 | B2 * | 6/2023 | Visvanathan | H01L 24/92 |
| | | | | 257/712 |
| 12,040,246 | B2 * | 7/2024 | Das Mahapatra | H01L 23/36 |
| 12,166,004 | B2 * | 12/2024 | Das Mahapatra | H01L 23/42 |
| 12,272,614 | B2 * | 4/2025 | Saha | H01L 23/42 |
| 2003/0173051 | A1 | 9/2003 | Rinella et al. | |
| 2004/0261987 | A1 | 12/2004 | Zhang et al. | |
| 2006/0227510 | A1 * | 10/2006 | Fitzgerald | H01L 24/32 |
| | | | | 257/E21.503 |
| 2008/0023665 | A1 * | 1/2008 | Weiser | H01L 23/3737 |
| | | | | 257/E23.107 |
| 2008/0153210 | A1 * | 6/2008 | Hua | H01L 23/433 |
| | | | | 257/E23.09 |
| 2008/0233682 | A1 | 9/2008 | Suh et al. | |
| 2010/0102442 | A1 * | 4/2010 | Sung | H01L 23/3732 |
| | | | | 257/E23.101 |
| 2011/0007477 | A1 | 1/2011 | Xu et al. | |
| 2014/0167246 | A1 * | 6/2014 | Ihara | H01L 24/33 |
| | | | | 438/122 |
| 2016/0126197 | A1 * | 5/2016 | Matoy | H01L 24/32 |
| | | | | 257/773 |
| 2020/0357764 | A1 * | 11/2020 | Das Mahapatra | H01L 23/42 |
| 2021/0134698 | A1 | 5/2021 | Arrington et al. | |
| 2021/0225729 | A1 | 7/2021 | Bozorg-Grayeli et al. | |

OTHER PUBLICATIONS

Restriction Requirement from U.S. Appl. No. 17/033,080 notified Nov. 30, 2023, 7 pgs.

* cited by examiner

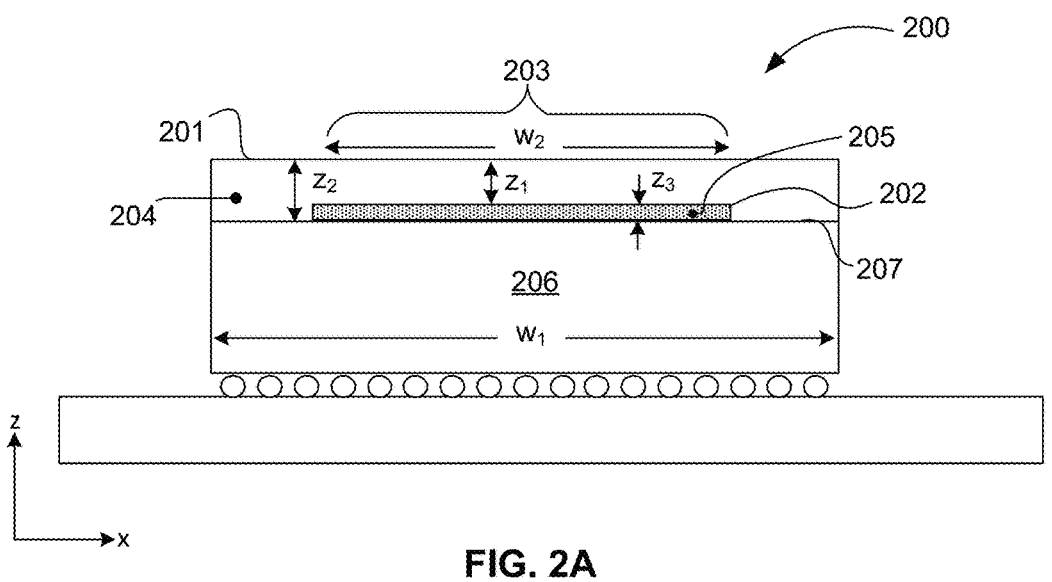
FIG. 2A
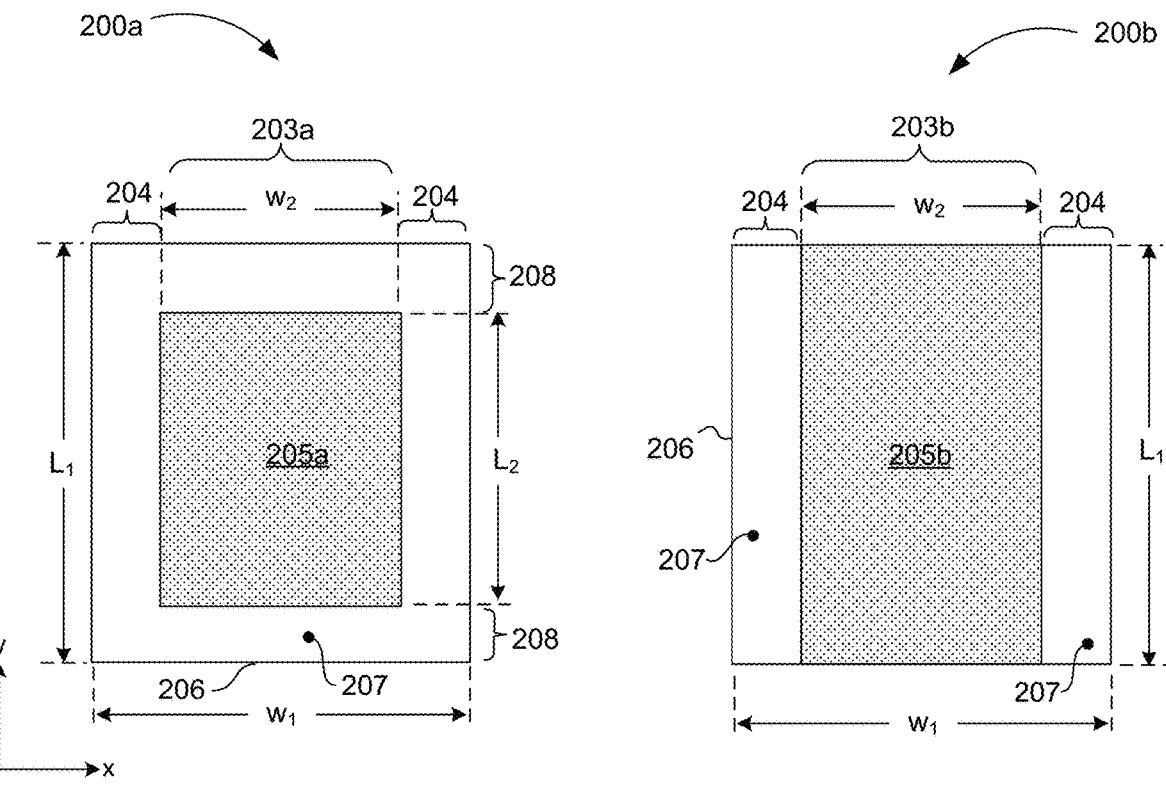
FIG. 2B                          FIG. 2C

500

DBM in solder electroplating bath
501

Electrodeposit solder layer on DBM
502

Produce STIM-cladding on DBM sheet
503

PERIPHERAL CONNECTIONS
1080

TO
1082

FROM
1084

1070

CELLULAR
1072

WIRELESS
1074

AUDIO
SUBSYSTEM
1020

PROCESSOR
1010

IO CONTROLLER
1040

MEMORY
SUBSYSTEM 1060

DISPLAY
SUBSYSTEM
1030

DISPLAY
INTERFACE
1032

POWER
MANAGEMENT 1050

CHIP-SCALE PACKAGE ARCHITECTURES CONTAINING A DIE BACK SIDE METAL AND A SOLDER THERMAL INTERFACE MATERIAL

CLAIM OF PRIORITY

This application is a continuation of, and claims priority to, U.S. patent application Ser. No. 17/033,080, filed on Sep. 25, 2020 and titled "CHIP-SCALE PACKAGE ARCHITECTURES CONTAINING A DIE BACK SIDE METAL AND A SOLDER THERMAL INTERFACE MATERIAL," which is incorporated by reference herein in its entirety.

BACKGROUND

Chip-scale package (CSP) architectures are evolving to reduce footprint and thickness for compliance with rising industry demand for ultra-small single-chip devices such as application-specific integrated circuits (ASICs), erasable programmable read-only memories (EPROMs), dedicated microprocessors and the like. To help achieve this goal, integrated circuit (IC) dies are made smaller and thinner to reduce overall package thickness, and package dimensions are reduced to house chips with a small margin of oversize. As the proportion of the CSP volume occupied by the chip itself grows, less space remains for package components such as integrated heat spreaders (IHS) for thermal management or for warpage-mitigating stiffeners. A mounting need exists to bring forward a new approach to thermal and warpage management in next-generation CSPs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A illustrates a cross-sectional view in the x-z plane of a package comprising a DBM having a recess and STIM within the recess, according to some embodiments of the disclosure.

FIG. 2B illustrates a plan view in the x-y plane of a package with the DBM removed to view the STIM, according to some embodiments of the disclosure.

FIG. 2C illustrates a plan view in the x-y plane of a package with the DBM removed to show an alternate STIM embodiment, according to some embodiments of the disclosure.

FIGS. 6A-6C illustrate cross-sectional views in the x-z plane of an exemplary process flow for forming bilayer foil comprising a DBM metal cladded by a STIM layer, according to some embodiments of the disclosure.

DETAILED DESCRIPTION

Figure 1A:
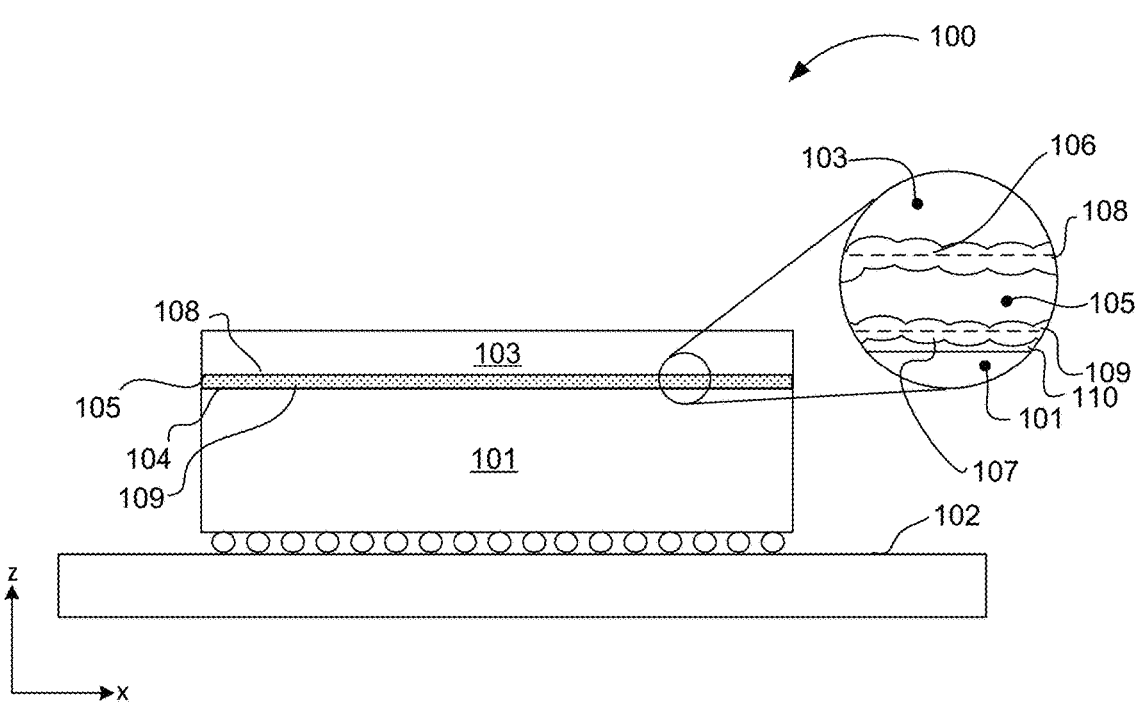
FIG. 1A illustrates a cross-sectional view in the x-z plane of an IC package comprising a die backside metal (DBM) bonded to a die with a solder thermal interface material (STIM), according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a package architecture comprising an integrated solution for both thermal and warpage management. In the disclosed embodiments, a die backside metal (DBM) having a high coefficient of thermal expansion (CTE) of 18 ppm/K or greater is attached to a die by an intervening thermal interface material comprising a solder (solder thermal interface material, STIM). The STIM has a high thermal conductivity (K) of 40 W/mK or greater and a low stiffness. The disclosed package architecture may be applicable to CSPs and to larger single- or multi-chip packages, including system-on-chip (SoC) packages and 3D packages incorporating vertically-integrated die stacks. The disclosed DBM may combine the functions of a conventional integrated heat spreaders (IHS) and stiffener into a single structure that has a smaller profile and footprint than either the IHS and stiffener.

Examples of high CTE materials that the disclosed DBM may comprise include copper, copper-zinc alloys (e.g., non-leaded brasses), aluminum, zinc-aluminum alloys, aluminum bronzes and nickel/copper alloys (e.g., 90-10 cupronickel). Other suitable materials having a CTE of $18 \times 10^{-6}$ m/mK (e.g., 18 ppm/K) or greater and a Young's modulus of 200 GPa or less may be employed. In some embodiments, the STIM may comprise high-K alloys of indium-gallium, indium-silver indium-aluminum, gallium-aluminum or alloys comprising tin, silver and copper. As described below, the STIM may be metallurgically (e.g., atomically) bonded to the DBM prior to attachment to die 101 and subsequent reflow. During package assembly, the STIM may be reflowed to bond the DBM to the die backside. According to some embodiments, the STIM has liquidus temperatures of 150° C. or higher. Depending on its composition, the STIM may have a particular reflow temperature at which formation of inter-metallic compounds (IMC) are formed with adjacent metal layers. For example, IMC formation may occur at the DBM/STIM interface by interdiffusion of atoms from the STIM layer into the adjacent DBM. Stable intermetallic phases (e.g., eutectics) having unique compositions comprising elements from both layers form and crystallize into thermodynamically stable compositional domains upon cooling, which may distribute themselves in single or multiple layers along the interface. Crystalline IMCs may aggregate as pure or mixed grains within domains. On the die side of the STIM, a wetting layer comprising a thin film of gold or other suitable metal may be present on the die backside surface to promote solder adhesion. Unique IMCs may form along the STIM/die interface, comprising gold, for example, in addition to the elements comprised by the STIM.

In some embodiments, a bilayer sheet comprising a DBM layer bonded to a STIM layer may be formed by cladding a first foil comprising the STIM material to a second foil comprising the DBM material. The DBM foil may be roller-cladded to a STIM foil, whereby a metallurgical bond is formed between the two foils by pressure-induced solid-state interdiffusion of atoms at the interface. The roller pressure may be adjusted to control the thicknesses of the individual layers within the bilayer sheet, resulting in a controlled thickness of the bilayer sheet. Alternatively, the cladding may be formed by electroplating the STIM material over a DBM foil.

In some embodiments, filler particles comprising nickel microspheres or other suitable metal microspheres and having a diameter of 50 microns or less may be embedded within the STIM. The metal microspheres may enhance warpage mitigation by providing a standoff layer between the DBM and the die, whereby the DBM maintains a constant distance from the die. The standoff layer may by engineered modulate warpage mitigation by providing CTE gradient between the DBM and the die.

According to some embodiments, the DBM may have a thickness ranging between 100 and 500 microns, and is bonded to the die through the STIM, which may have a thickness (e.g., a bond line thickness, BLT) ranging between 50 and 150 microns. The BLT of the high-K STIM may be substantially thinner than BLTs associated with conventional TIMs, therefore providing very low thermal resistance between the die and the DBM when compared to conventional TIMs (e.g., a conventional TIM thermally coupling the die to an IHS) comprising a relatively low-K material (e.g., $\kappa < 10$ W/mK). As noted above, the STIM has a high thermal conductivity to allow unimpeded transfer of heat generated within the die to the DBM, which may be contacted to a heat sink, cold plate or heat pipe in some device implementations. Depending on the amount and rate of heat generation by the die, the DBM itself may provide sufficient thermal mass to perform as an internal heat sink without need for an external heat sink.

The disclosed DBM/STIM architecture may exhibit enhanced warpage mitigation over more conventional package architectures (e.g., inclusion of a stiffener). For example, the disclosed DBM/STIM architecture may reduce warpage magnitude at high temperatures. In particular, the disclosed DBM/STIM architecture may suppress curvature reversal that may be observed in conventional package architectures, resulting in a permanent concave warpage of the package. For example, the package may be subjected to large temperature swings (e.g., up to 260° C.) occurring during multiple reflow operations. For example, solder ball attach operations may be performed at a reflow temperature of 240° C., and surface mount (SMT) operations may be performed at a reflow temperature of 190° C. for package attachment to a PCB.

In conventional package architectures, warpage may undergo reversal above 150° C. For example, native warpage of the package below 150° C. may be convex. At temperatures above 150° C., package warpage may reverse, changing from the native convex curvature to concave curvature exhibited at high temperatures. Consequences of this warpage reversal may be significant. For example, during SMT the warpage reversal may compromise solder joint integrity between package and PCB. Post SMT, the package may be subject to hundreds or thousands of high temperature excursions above 100C due to high heat generation by the die during operation. The extreme flexure may crack the die, weaken and break SMT solder joints (between package and PCB), or even break BGA solder joints between die and substrate. The disclosed DBM/STIM architecture may mitigate large package flexure by suppressing curvature reversal, for example, maintaining a convex warpage at temperatures well above 150° C.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the x-z plane of package 100 comprising die backside metal (DBM) 103 and solder thermal interface material (STIM) 105, according to some embodiments of the disclosure.

Package 100 comprises die 101 electrically coupled to substrate 102. DBM 103 is attached to die backside 104 by solder thermal interface material (STIM) 105. DBM 103 comprises a material having a coefficient of thermal expansion (CTE) of 18 ppm/K or greater. Examples of high CTE materials include, but are not limited to, copper, copper-zinc alloys (e.g., non-leaded brasses), aluminum, zinc-aluminum alloys, aluminum bronzes and nickel/copper alloys (e.g., 90-10 cupronickel). Other suitable materials having a CTE of 18 ppm/K or greater and a Young's modulus of 200 GPa or less may be employed. In some embodiments, DBM 103 has a z-height that ranges between 100 microns and 500 microns.

STIM 105 comprises one or more high-k materials having a thermal conductivity (K) of 40 W/mK or greater. Examples of high-K materials include, but are not limited to, alloys of indium and silver or alloys of tin, aluminum, silver and copper. STIM 105 may also have a low Young's modulus to enable flexure or die 101 as well as DBM 103 without delamination or cracking. In some embodiments, STIM 105 has a z-height ranging between 10 microns and 150 microns.

Referring to the inset in FIG. 1A, intermetallic compounds (IMCs) 106 and 107 are distributed along the STIM/DBM interface 108 and STIM/die interface 109, respectively. IMCs 106 and 107 may each be a conglomeration of several specific intermetallic compounds that are formed between STIM 105 and DBM 103 during attachment of DBM 103 to die 101. As an example, DBM 101 may comprise a copper-aluminum alloy, and STIM 105 may comprise an alloy of indium-silver-tin. IMC 106 may be formed upon reflow of STIM 105, whereby STIM 105 may undergo a phase change to the liquidus state at the reflow temperature (e.g., 240° C.). An interdiffusion of copper atoms of and indium and/or silver from materials on each side of interface 108 may occur, forming new solid-state compounds (e.g., IMCs) comprising elements form each material. Examples of IMCs formed by interdiffusion of DBM and STIM materials may include copper-indium (CuIn), copper-indium-silver (CuInAg) and copper-indium-tin (CuInSn).

Likewise, IMCs 107 may form along interface 109 between die 101 and STIM 105. IMCs 107 may be compositionally different from IMCs 106. Die backside 104 may have an adhesion layer (e.g., adhesion layer 110) to increase wetting of solder over the silicon of die backside 104. For example, adhesion layer 110 may comprise gold. During reflow, interdiffusion of indium, silver and tin into the gold layer (and diffusion of gold atoms into the STIM) may create IMCs comprising gold, such as $AuIn_2$, a stable IMC.

Figure 1B:
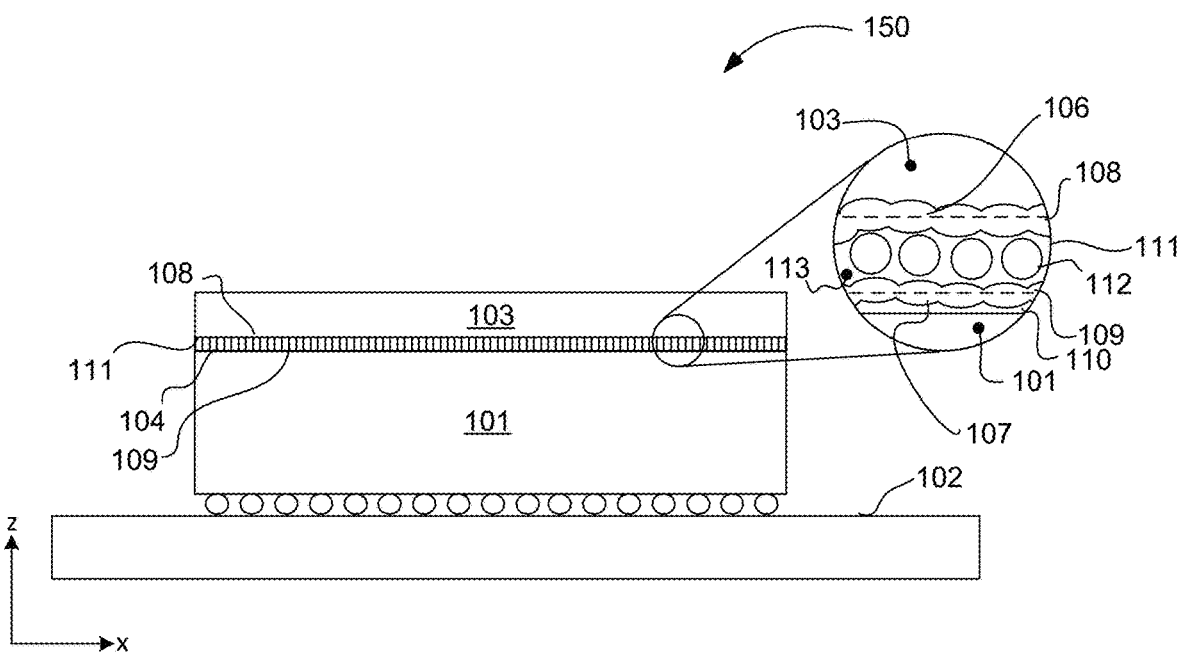
FIG. 1B illustrates a cross-sectional view in the x-z plane of an IC package comprising a DBM bonded to a die with a STIM comprising a plurality of filler particles, according to some embodiments of the disclosure.

FIG. 1B illustrates a cross-sectional view in the x-z plane of package 150 comprising DBM 103 and STIM 111 comprising a plurality of filler particles 112, according to some embodiments of the disclosure.

STIM 111 comprises a plurality of filler particles 112 embedded within metal matrix 113 comprising a low-temperature alloy comprising indium, gallium, aluminum, tin, silver and other suitable metals, as noted above. In some embodiments, filler particles 112 are microspheres having average diameters of 100 microns or smaller. In some embodiments, filler particles 112 comprise high-k metals such as, but not limited to, nickel, copper, silver, gold, cobalt and aluminum. Filler particles 112 may provide a CTE gradient between DBM 103 and die 101. As an example, DBM 103 may comprise pure copper (CTE 17 ppm/K) a copper-zinc alloy, an example being yellow brass, comprising 65% copper and 35% zinc (e.g., UNS C27000; UNS=metals industry's united numbering system for alloy designation), having a CTE of 20 ppm/K. Depending on composition, STIM matrix 113 may have a CTE comparable to that of DBM 103. In contrast, silicon has a CTE of 2.3-2.5 ppm/K. By inclusion of filler particles 112 having a smaller CTE, the overall CTE of the STIM (e.g., STIM 111) may be reduced. An example of a suitable filler particle may be nickel microspheres, having a CTE of approximately 13-14 ppm/K and a mean diameter of 100 microns or less.

Warpage control of package 150 (and package 100) is a function of the CTE differential between DBM 103 and STIM 111 may have a CTE that is intermediary between DBM 103 and die 101 (e.g., comprising silicon, CTE~2.5 ppm/K), enabling a reduction in counter warpage. In addition to engineering the CTE of the STIM, filler particles 112 may act as standoffs within the STIM layer, preventing the STIM from collapsing during reflow or compressing when package 150 undergoes changes in warpage in response to temperature cycling.

Figure 1C:
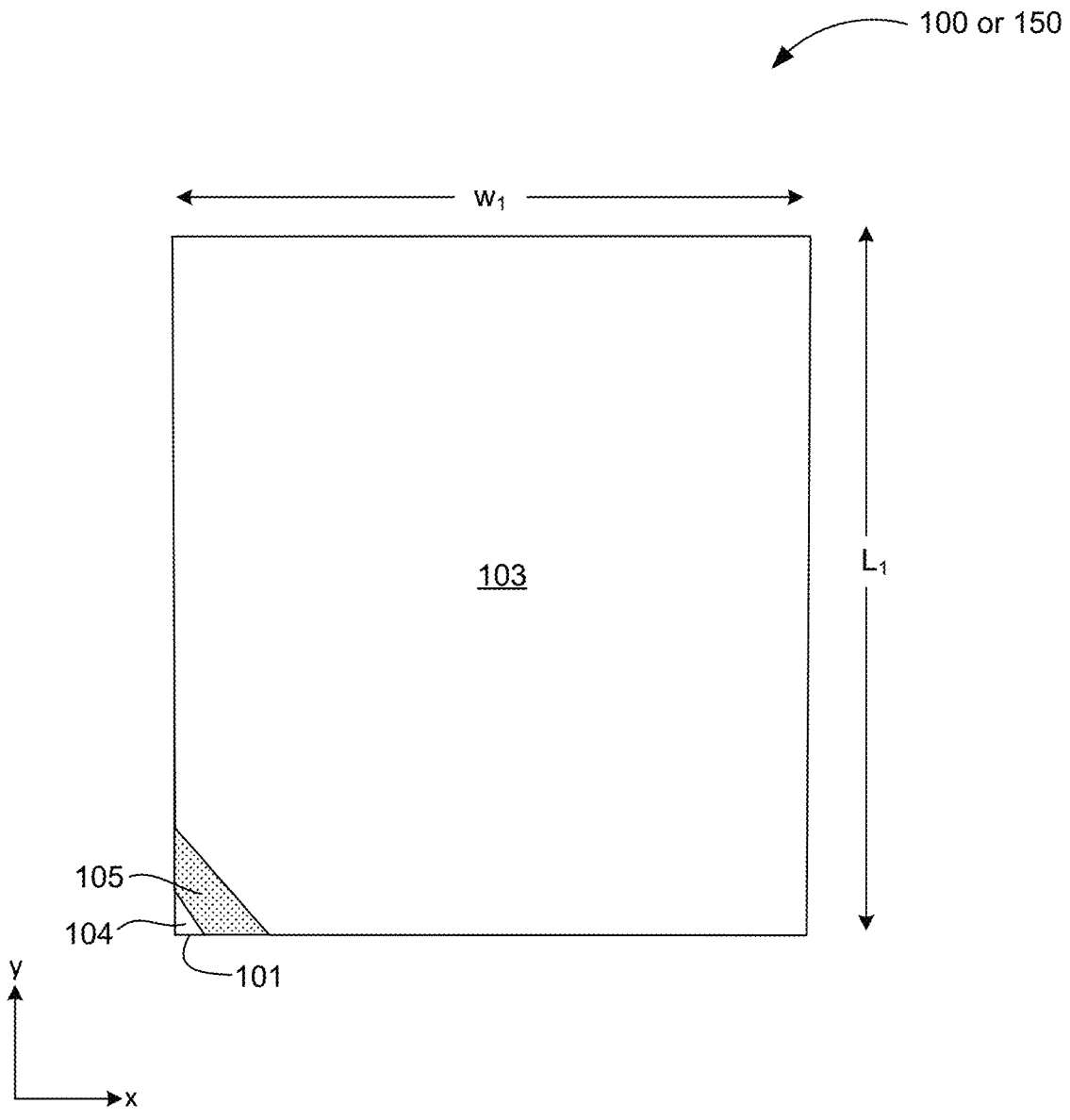
FIG. 1C illustrates a plan view in the x-y plane of the package shown in FIGS. 1A and 1B, according to some embodiments of the disclosure.

FIG. 1C illustrates a plan view in the x-y plane of package 100 or 150 comprising DMB 103 and STIM 105, according to some embodiments of the disclosure.

In illustrated embodiment, DBM 103 and STIM 105 or 111 cover substantially all of die backside surface 104, both structures extending a length L (y-direction) and width w (x-direction), defining the lateral dimensions of die 101. The substantially total coverage of the surface of die backside 104 by DBM 103 and STIM 105 (or STIM 111) may maximize warpage control in both dimensions (x and y) by maximizing the overall thermal expansion of DBM 103. In addition, thermal management may be maximized by providing the shortest thermal path possible for heat generated from any point within die 101 to flow to DBM 103 through STIM 105 (111).

FIG. 2A illustrates a cross-sectional view in the x-z plane of package 200, comprising DBM 201 comprising recess 202 and STIM 205 within recess 202, according to some embodiments of the disclosure.

Package 200 comprises DBM 201, which includes recess 202 in central portion 203 of DBM 201. In the cross section, DBM has a variable profile, whereby a central portion 203 has a z-height $z_1$ and peripheral portion 204 has a z-height $z_2$, where $z_2 > z_1$. Recess 202 has a depth 23 that is approximately the difference between $z_2$ and $z_1$. STIM 205 fills recess 202, and may have a lateral dimension approximately equal to $w_2$. In general, $w_2$ is less than width $w_1$ of die 206, and a z-height approximately equal to $z_3$. In some embodiments, $z_3$ ranges from 10 to 150 microns. The compositions of DBM 201 and STIM 205 may be substantially the same as described for DBM 103 and STIM 105, described above.

As described above, STIM 205 attaches DBM 201 to backside surface 207 of die 206. In the illustrated embodiment, STIM 205 extends partially across die 206, providing efficient heat transfer from the central portion of die 206 (e.g., portion 203), while the peripheral portions 204 are not contacted by STIM 205. An air gap or conventional TIM may be between the peripheral regions 204 of die 206 and DBM 201. In some implementations, die 206 may not comprise power-consuming circuitry in peripheral portions 204, therefore vertical heat transfer into DBM 201 from the periphery of die 206 may not be critical for thermal management of die 206.

FIG. 2B illustrates a plan view in the x-y plane of package 200a, with DBM 201 removed to view STIM embodiment 205a, according to some embodiments of the disclosure.

In the illustrated embodiment, package 200a is shown in the plan view below without DBM 201, showing the lateral extents of STIM 205a, receded from edges of die 206. In the illustrated embodiment, STIM 205a has width $w_2$ and length $L_2$, and covers central portion 203a of die 206 having width $w_2$ and length $L_2$. STIM 205a does not extend into peripheral portions 204 and 208 of die 206, which surround STIM 205 on all four sides. Width $w_2$ and length $L_2$ are both less than $w_1$ and $L_1$, respectively, where $w_1$ and $L_1$ are the lateral dimensions of die 206.

In some embodiments, STIM 205a is intimately contacted to die backside 207 through a solder bond within central portion 203a. While DBM 201 extends over peripheral portions 204 and 208, it is bonded to die 206 only in the central portion 203a. STIM 205a has a z-height $z_3$, shown in FIG. 2A, ranging between 10 and 150 microns. STIM 205a may fill recess 202 of DBM 201 (FIG. 2A). The z-height of STIM 205a may be determined in part by its thermal conductivity K. While the illustrated embodiment shows STIM 205a having a rectangular shape, STIM 205a may have other shapes, including round edges.

FIG. 2C illustrates a plan view in the x-y plane of package 200b with DBM 201 removed to show alternate STIM embodiment 205b, according to some embodiments of the disclosure.

In the illustrated embodiment, STIM 205b extends the full length $L_1$ of die 206, while having width $w_2$, covering central portion 203b of die 206, whereby central portion 203b has width $w_2$ and length $L_1$. STIM 205b does not extend over peripheral portions 204 of die 206, however extends over the upper and lower peripheral portions of die 206 (e.g., extending over peripheral portions 208 in FIG. 2B). DBM 201 may be bonded to die backside surface 207 by STIM 205b, along central portion 203b, extending substantially the full length $L_1$ of die 206.

The reduced contact area between STIM 205a and 205b with die 206 limits the attachment footprint of DBM 201. A limited attachment footprint of DBM 201 to die 206 may reduce tensile strain in the x and/or y dimensions between the two structures as only the thermal expansion of the central portion 203a or 203b of DBM 201 places tension on die 206, thus limiting the magnitude of counter warpage afforded by thermal expansion of DBM 201 in the x or x and y dimensions, respectively.

Figure 3:
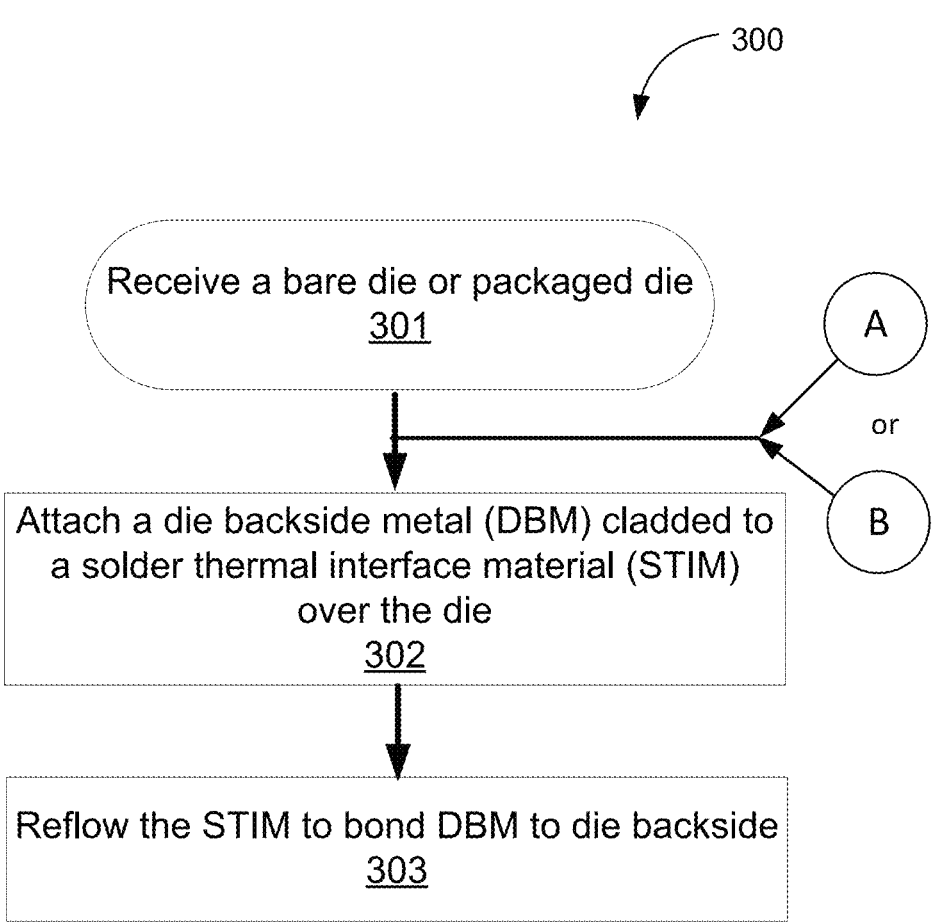
FIG. 3 illustrates a process flow chart summarizing an exemplary process flow for making a package comprising a DBM anchored to a die by a STIM for warpage and thermal management, according to some embodiments of the disclosure.

FIG. 3 illustrates process flow chart 300 summarizing an exemplary process flow for making a package comprising a DBM anchored to a die by a STIM for warpage and thermal management, according to some embodiments of the disclosure.

Referring to operation 301, a bare die or unfinished package after die attach is received into a process line for attaching a DBM to the die backside. The die may be received as part of a wafer in preparation for wafer-level packaging (WLP) for CSP fabrication, for example, during which interconnects and encapsulation have been simultaneously made in a previous operation for each of the dies on a single wafer. In some embodiments, an interposer or fan-out (or fan-in) redistribution layers may be included for contacts to high density ICs that may be included in the CSP. In some embodiments, the die has been previously singulated and may be supported on a package substrate attached to a carrier. Multiple packages may be supported on the same carrier. In some embodiments, the die may be received as a bare die singulated from a wafer in a previous operation, or as part of an un-diced wafer.

Referring to operation 302, a DBM is attached to the die backside. In WLP operations, the wafer may be inverted to place the wafer backside on top, where it may be available for DBM attach.

In some embodiments, the DBM attach is performed at wafer level, whereby a sheet of the DBM metal cladded to a thin sheet comprising the STIM material is attached to the wafer backside. In some embodiments, the wafer is diced and reconstituted on a carrier to enable formation of a fan out redistribution layer. Exemplary methods of cladding the DBM metal to the STIM material are described below. In some embodiments, the DBM is cladded to the STIM in upstream operations, then singulated to produce chip-scale units for attachment to individual dies in single die or WLP package assembly by pick and place methods, whereby the STIM material is contacted to the individual die(s). A wetting layer comprising for example a thin film of gold (or alternatively a copper-zinc alloy), may be deposited over the bare silicon of the die or wafer backside. In some embodiments, the pick-and-place operation may be conducted as part of alternative WLP processes, whereby chip-scale units are placed on multiple un-singulated dies on a wafer.

It is noted that a certain degree of warpage of a silicon wafer or singulated dies may exist before DBM attach, notably in the case of WLP or single die packaging, whereby CTE mismatch between and the die silicon and package substrate material produces strain in the die. For example, the substrate material commonly comprising an organic polymer, which has a higher CTE than the silicon. During heating and cooling, thermal expansion and contraction may cause the package to dynamically warp, cycling through decreases and increases in the amount of and curvature of flexure, including reversal of curvature of warpage in some cases. For example, at elevated temperatures, the die (CTE 2.5 ppm/K) expands more slowly than the polymeric substrate (CTE 10 ppm/K), causing the die/substrate assembly (having the die on top, substrate on the bottom) to undergo concave warpage, where the die/substrate assembly is bowed downward. Upon cooling to room temperature (e.g., 25° C.), the warpage may reverse, returning to a convex warpage where the assembly is bowed upward.

Referring to operation 303, the STIM is reflowed at an elevated temperature to bond the DBM to the die. During reflow, the STIM is heated to a temperature near its liquidus temperature. For example, the STIM may reach a liquidus state at 240° C. As previously noted, the die may exhibit an initial warpage at room temperature due to thermal stain induced by an underlying substrate, and undergo warpage reversal at elevated temperatures during temperature ramping. In some embodiments, a capillary underfill material may be used to hold the chip-scale DBM pieces in place. In some operations, the DBM and die assembly may be compressed to maintain planarity and mitigate warpage during reflow. For example, reflow may be performed by thermo-compression bonding apparatus to apply pressure to the assembly held between heated platens.

Once bonded, the DBM is integral with the die. For DBM attach and reflow in WLP on an intact wafer, the DBM is integral with the backside of the wafer and may be diced into chip-scale units during wafer singulation.

Figure 4:
FIG. 4 illustrates a flow chart summarizing an exemplary process to form a bilayer metal foil comprising a DBM material cladded by an STIM material by roller bonding, according to some embodiments of the disclosure.
Figure 4:
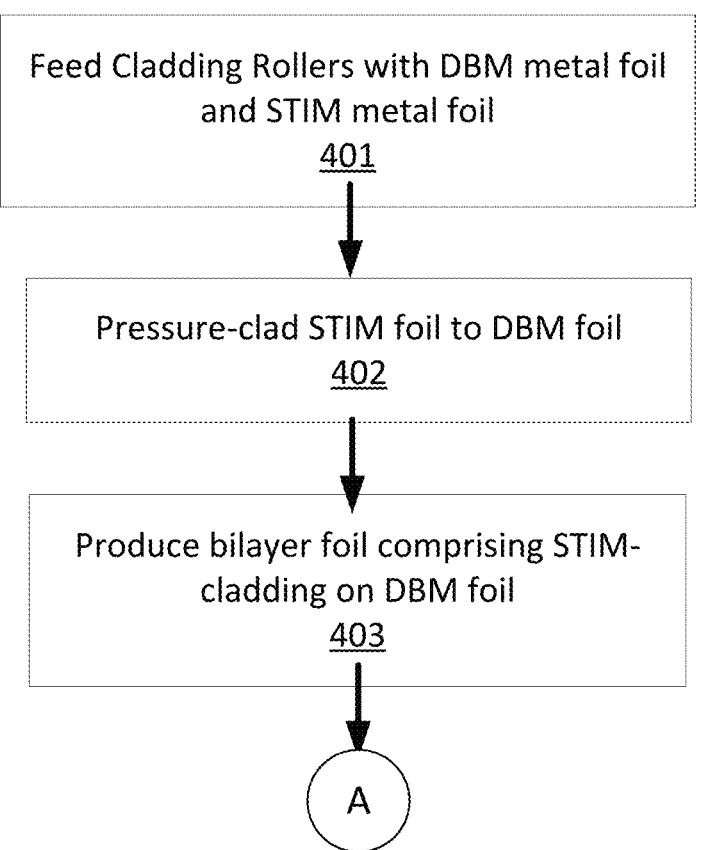

FIG. 4 illustrates flow chart 400 summarizing an exemplary process to form a bilayer metal foil comprising a DBM material cladded by an STIM material by roller bonding, according to some embodiments of the disclosure.

Referring operation 401, a roller apparatus is employed to pressure clad a sheet of STIM material to a sheet of DBM material. Separate foils comprising a STIM material (e.g., In—Ag—Sn alloy) and a DBM material (e.g., copper) may be fed between rollers to produce the bilayer metal foil. The roller pressure may be adjusted to pressure-bond the two foils together at the interface between the two foils. The final thickness of the bilayer foil may be adjusted by the roller pressure. Initial foil thicknesses may be several times their final thickness once clad together.

Referring to operation 402, the roller pressure may be adjusted to compression bond the foils together along the interface between the two foils. An IMC may form along the interface by solid-state interdiffusion of atoms from each foil. Roller pressure may cause some plastic deformation of the material in each foil, thinning and elongating each foil. The roller pressure may be adjusted to produce a bilayer cladded foil having a controlled overall thickness and thicknesses of each layer.

Referring to operation 403, a bilayer foil comprising the DBM material having a cladding of the STIM foil is produced. The cladded DBM metal may be introduced into the package process summarized in CSP packaging process flow chart 300 (FIG. 3), at the juncture labeled "A".

Figure 5:
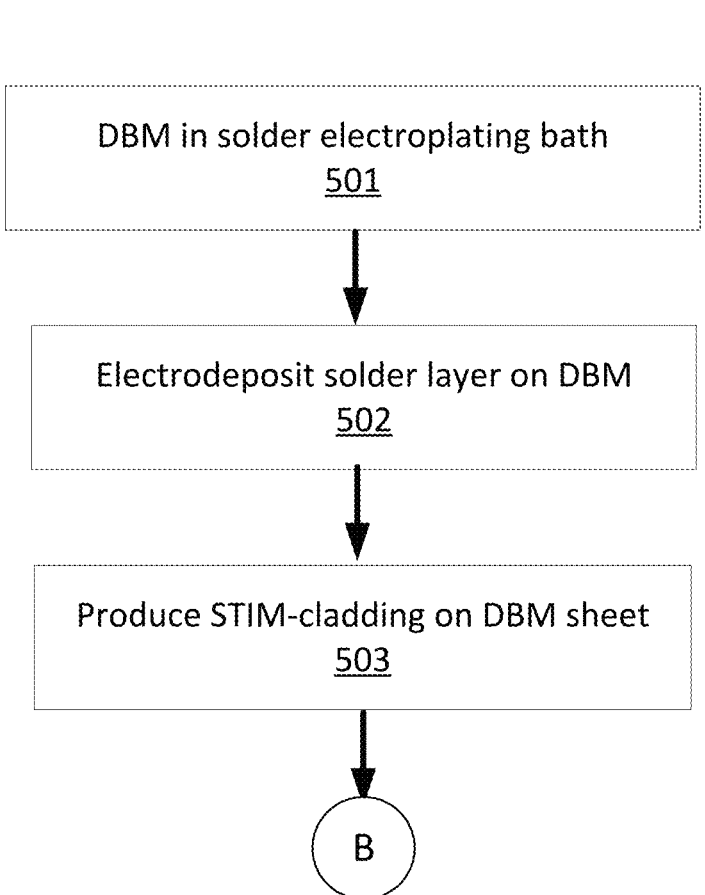
FIG. 5 illustrates a flow chart summarizing an exemplary process to form a bilayer metal foil comprising a DBM material cladded by an STIM material by an electroplating method, according to some embodiments of the disclosure.

FIG. 5 illustrates flow chart 500 summarizing an exemplary process to form a bilayer metal foil comprising a DBM material cladded by an STIM material by an electroplating method, according to some embodiments of the disclosure.

Referring to operation 501, a foil of a DBM material (e.g., copper) is immersed in a suitable solder plating bath and connected to a power supply or potentiostat. The plating bath may comprise ions of silver, indium and tin. Other suitable metals may be included or substituted that may be included in a STIM formed by the electroplating process. The DBM foil may comprise any suitable material having a CTE of at least 18 ppm/K, and is amenable to serving as a cathode substrate under the prescribed plating conditions.

Referring to operation 502, the STIM is electrodeposited over the DBM metal foil. The STIM may be electrodeposited to any desired thickness. In some embodiments, the STIM material may be electrodeposited through a lithographically-defined plating mask, for example, one formed by photolithography. An example is formation of a STIM only within a defined recess that may be stamped or etched in the DBM foil (e.g., recess 202 illustrated in FIG. 2A).

Referring to operation 503, a bilayer foil comprising the DBM material having a cladding of the STIM foil is produced. The cladded DBM metal may be introduced into the package process summarized in CSP packaging process flow chart 300 (FIG. 3), at the juncture labeled "B".

Figures 6A, 6B, 6C:
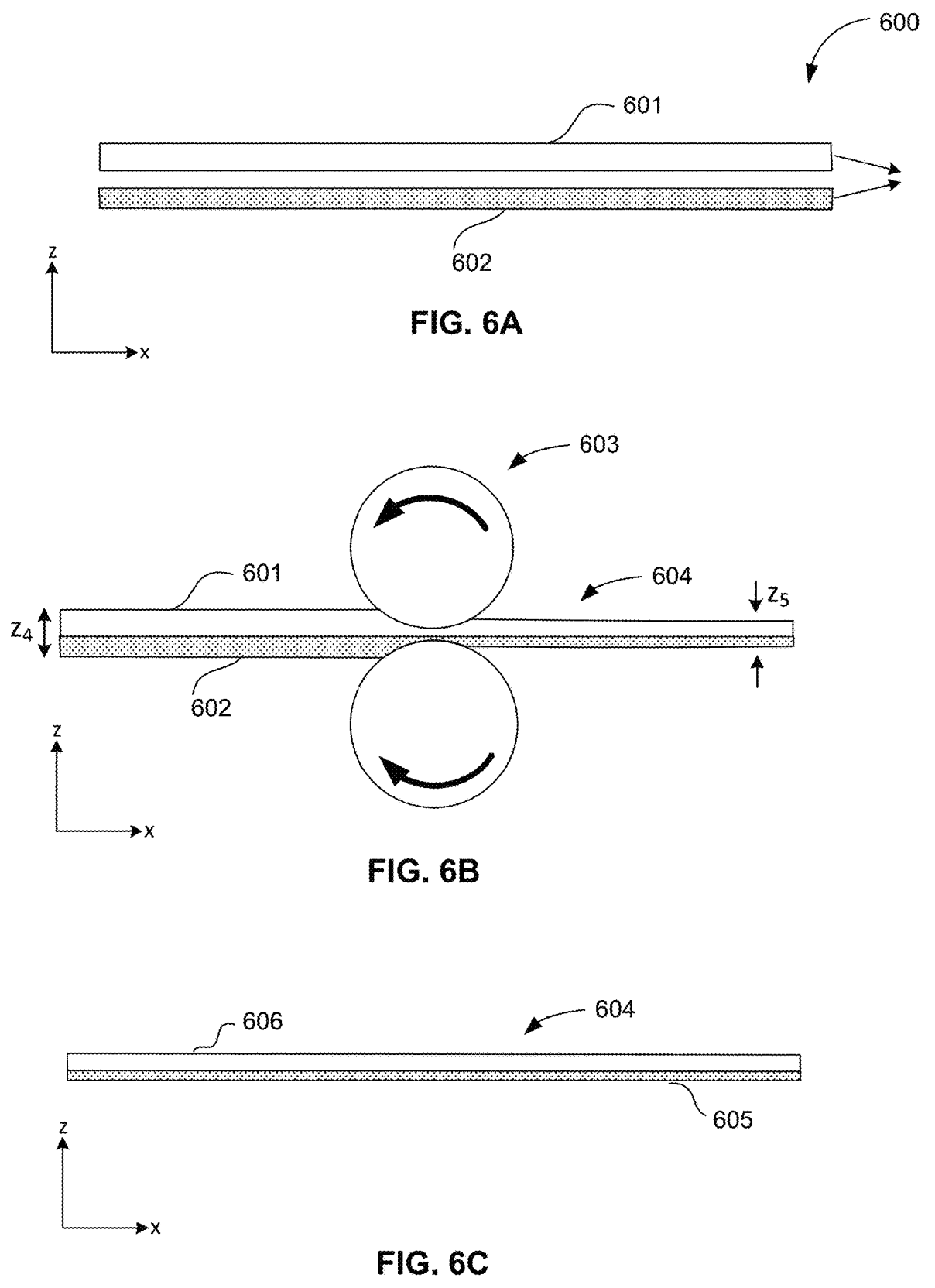

FIGS. 6A-6C illustrate cross-sectional views in the x-z plane of exemplary process flow 600 for forming bilayer foil comprising a DBM metal cladded by a STIM layer, according to some embodiments of the disclosure.

In FIG. 6A, DBM foil 601 and STIM foil 602 are aligned and merged for simultaneous feed into roller cladding apparatus 603, shown in FIG. 6B. DBM foil 601 may comprise copper, zinc, aluminum or nickel, combinations of which may be combined in alloys having CTEs of at least 18 ppm/K. STIM foil 602 may be formed by, for example, rolling slabs of molten solders comprising indium, silver, tin and copper into continuous thin foil sheets or rolls.

In FIG. 6B, STIM foil 602 is cladded to DBM foil 601 by pressure bonding, forming bilayer foil 604. An IMC may be formed along the interface between STIM foil 602 and DBM foil 601 by cold-rolling at pressure (load) high enough to induce solid state interdiffusion of metal atoms from each foil across the interface between the adjacent foils. The rolling process may thin the foils by plastically deformation. For example, the initial thickness of the aligned foils 601 and 602 may be $z_4$. After cladding, the cladded foil 604 has a thickness $z_5 < z_4$. FIG. 6C shows the finished bilayer foil 604, comprising STIM cladding layer 605 over DBM layer 606.

Figure 7A:
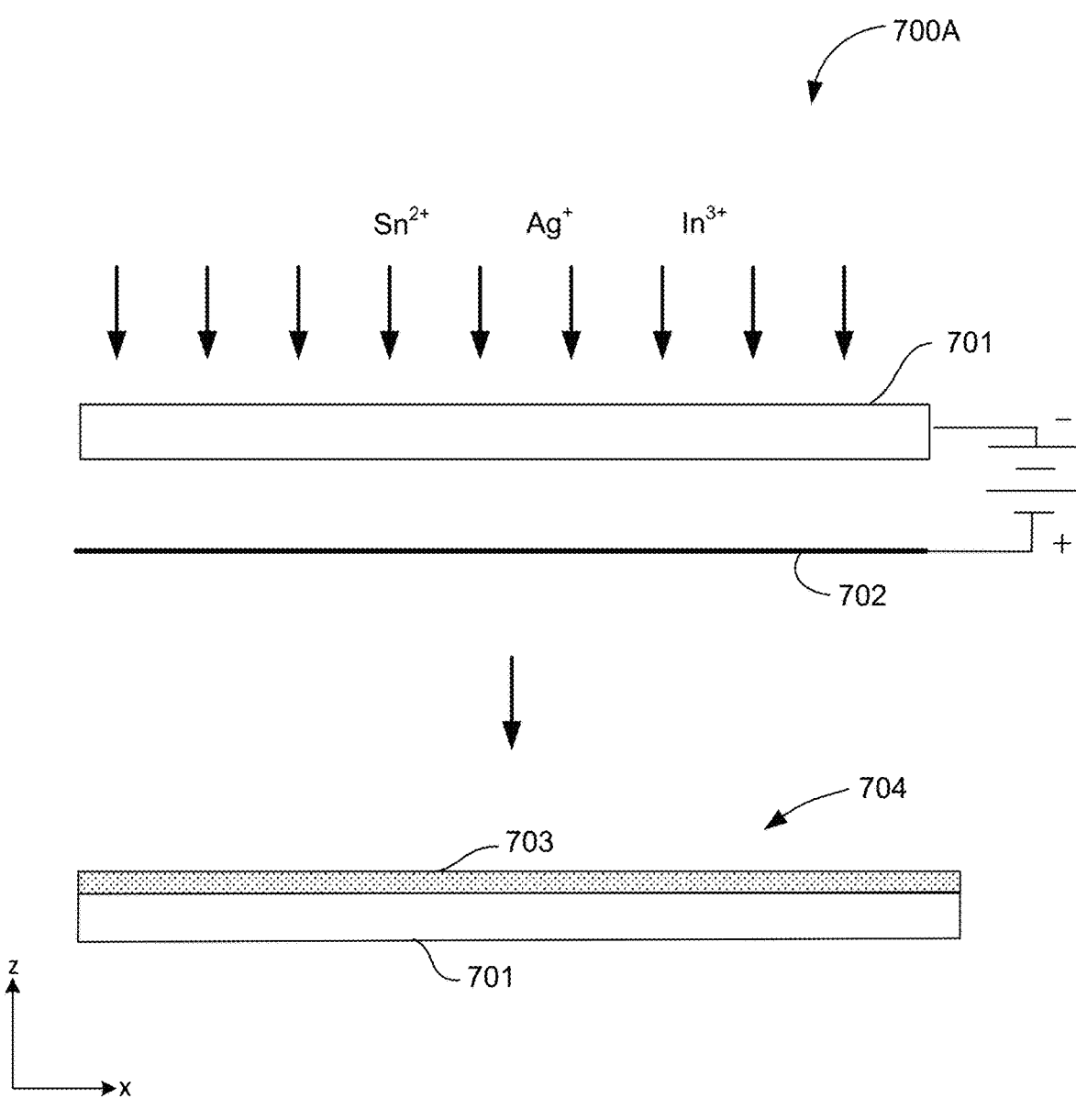
FIGS. 7A and 7B illustrate cross-sectional views in the x-z plane of electrochemical process flows for formation of bilayer foil comprising a DBM layer and an electroplated STIM layer, according to some embodiments of the disclosure.
Figure 7B:
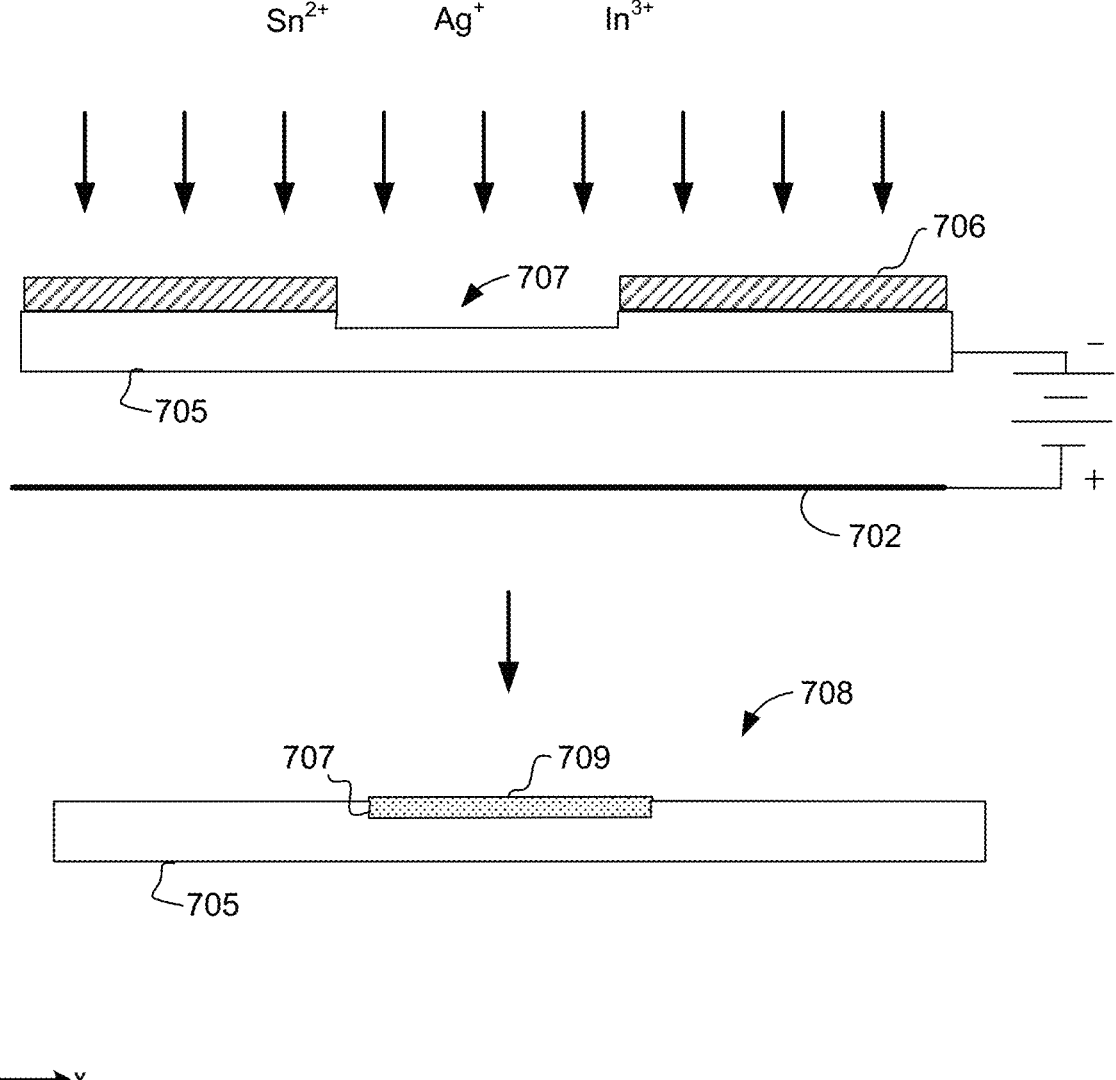

FIGS. 7A and 7B illustrate cross-sectional views in the x-z plane of electrochemical process flows 700A and 700B, respectively, for formation of bilayer foil comprising a DBM layer and an electroplated STIM layer, according to some embodiments of the disclosure.

In FIG. 7A, process flow 700A is illustrated, showing a flood electroplating method for making bilayer foil 704. DBM foil 701 may be connected to the negative terminal of a source of electrical power (represented by the battery symbol), such as a potentiostat or power supply. DBM foil 701 may be immersed in a solder plating bath as a cathode juxtaposed to anode 702. The plating bath may comprise ions of indium, silver and tin, as shown in the illustrated example. The downward arrows in the figure indicate electrodeposition of the metal ions onto the surface of DBM foil 701 to form STIM cladding 703 over DBM foil 701, resulting in bilayer foil 704.

Directed electrodeposition for formation of a patterned STIM layer within a recess formed in a DBM foil is shown in FIG. 7B, illustrating exemplary process flow 700B. DBM foil 705 is shown covered by plating mask 706, patterned to expose recess 707. Plating mask 706 may be a photoresist layer. DBM foil 705 may be immersed in a plating bath comprising ions of STIM alloy constituents (e.g., tin, silver and indium), connected to a power source (represented by the battery symbol) and anode 702.

In the illustrated embodiment, electroplating through mask 706 results in formation of STIM cladding layer 709 within recess 707. In FIG. 7B, mask 706 is removed to show bilayer foil 708 comprising DMB 705 and patterned STIM cladding layer 709. Bilayer foil 708 may be cut to chip-scale DBM units similar to DBM 201 illustrated in FIGS. 2A-2C.

Figure 8A:
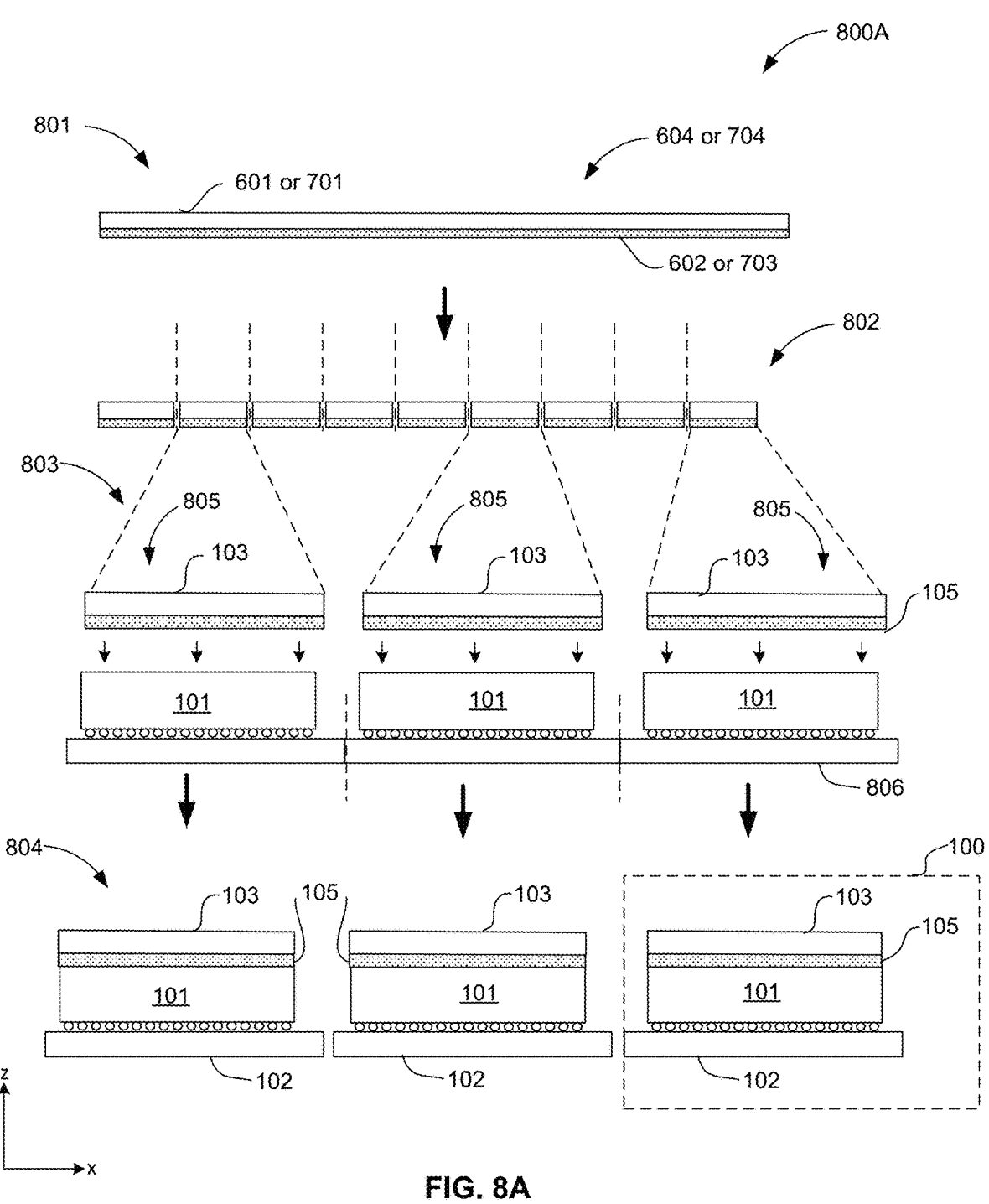
FIG. 8A illustrates a cross-sectional view in the x-z plane of an exemplary process flow for forming the package illustrated in FIGS. 1A-1C, according to some embodiments of the disclosure.

FIG. 8A illustrates a cross-sectional view in the x-z plane of exemplary process flow 800A for forming package 100, according to some embodiments of the disclosure.

In the illustrated embodiment, intact bilayer foil 604 (or 704) is introduced into process 800A at operation 801. Bilayer foil 604 (704) comprises a DBM foil layer (e.g., DBM foil layer 601 or 701) and a STIM cladding layer (e.g., STIM cladding layer 602 or 703). Referring to operation 802, bilayer foil 604 (or 704) is diced into multiple chip-scale DBM foil pieces 805. Operation 803 comprises a WLP pick-and-place operation, whereby chip-scale DBM foil pieces 805 are attached to multiple un-singulated dies 101 arrayed on substrate wafer 806 (e.g., comprising un-singulated package substrates 102).

Referring to operation 804, STIMs 105 are reflowed to solder-bond DBMs 103 to dies 101. STIM substrate wafer 806 is subsequently diced to produce multiple singulated packages 100, delineated by the dashed enclosure.

Figure 8B:
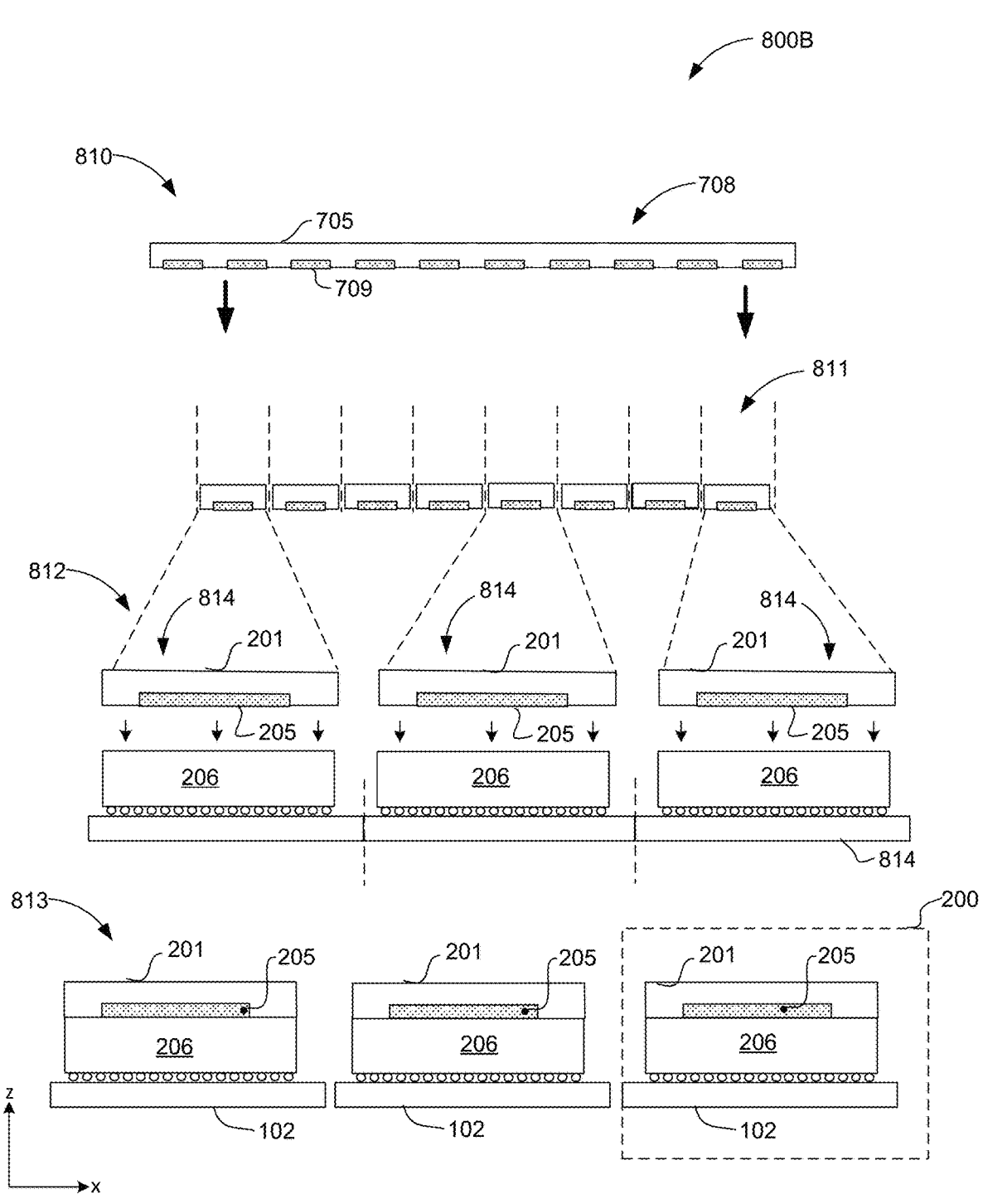
FIG. 8B illustrates a cross-sectional view in the x-z plane of an exemplary process flow for forming the package illustrated in FIGS. 2A-2C, according to some embodiments of the disclosure.

FIG. 8B illustrates a cross-sectional view in the x-z plane of exemplary process flow 800B for forming package 200, according to some embodiments of the disclosure.

In the illustrated embodiment, intact bilayer foil 708 (FIG. 7B) is introduced into process 800B at operation 810. Bilayer foil 708 comprises a DBM foil layer 705 comprising recesses 707 and multiple STIMs 709 patterned cladding within recesses 707. Referring to operation 811, bilayer foil 708 is diced into multiple chip-scale DBM foil pieces 814, each comprising a single STIM (e.g., STIM 205) cladded to DBMs 201. Operation 812 comprises a WLP pick-and-place operation, whereby chip-scale DBM foil pieces 814 are attached to multiple unsingulated dies 206 arrayed on substrate wafer 814 (e.g., comprising unsingulated package substrates 102).

Referring to operation 813, STIMs 205 are reflowed to solder-bond DBMs 201 to dies 206. STIM substrate wafer 806 is subsequently diced to produce multiple singulated packages 200, delineated by the dashed enclosure.

Figure 9A:
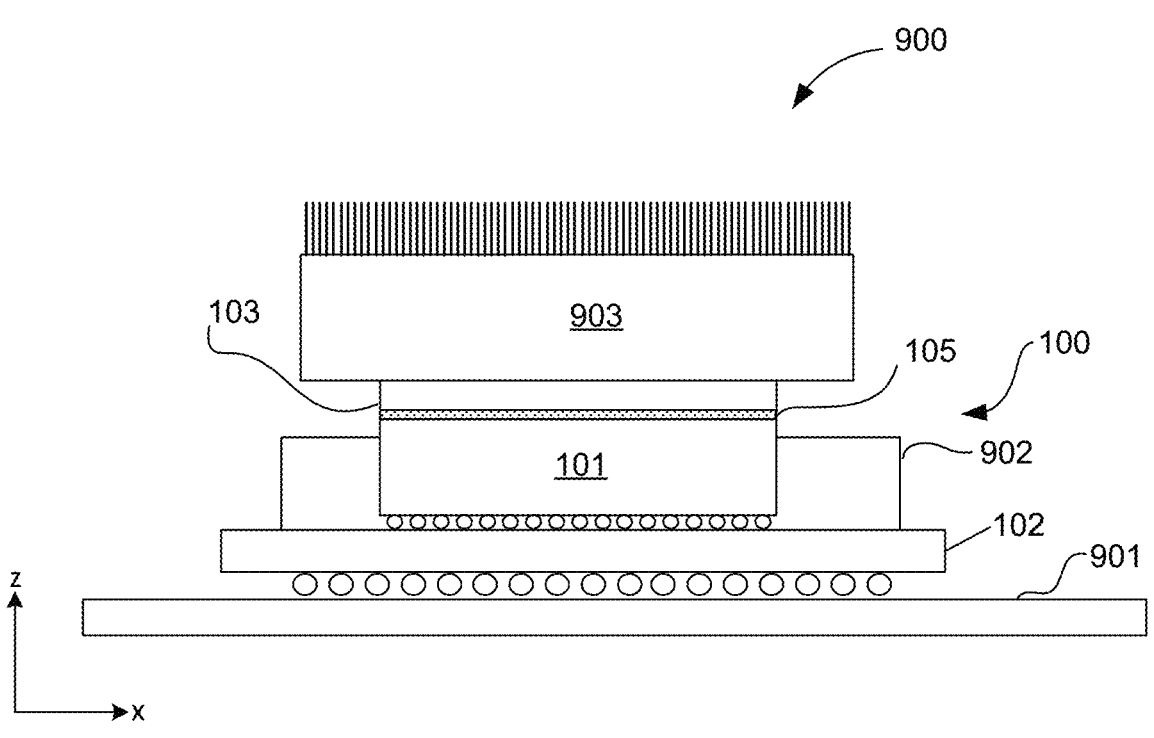
FIG. 9A illustrates a cross-sectional view in the x-z plane of an exemplary implementation comprising the CSP package illustrated in FIGS. 1A-1C, according to some embodiments of the disclosure.

FIG. 9A illustrates a cross-sectional view in the x-z plane of exemplary implementation 900, comprising CSP package 100, according to some embodiments of the disclosure.

In exemplary implementation embodiment 900, CSP package 100 is surface mounted to PCB 901, which may be a computer motherboard, but circuit boards employed in other suitable devices may be embodied by PCB 901. In alternate embodiments, CSP package 100 may be seated in a socket (not shown) mounted on PCB 901. Package 100 may include epoxy mold 902 encapsulating die 101, with DBM 103 remaining free of encapsulation material. DBM 103 is contacted by heat sink 903. In some embodiments, heat sink 903 is a cold plate or a heat pipe.

Figure 9B:
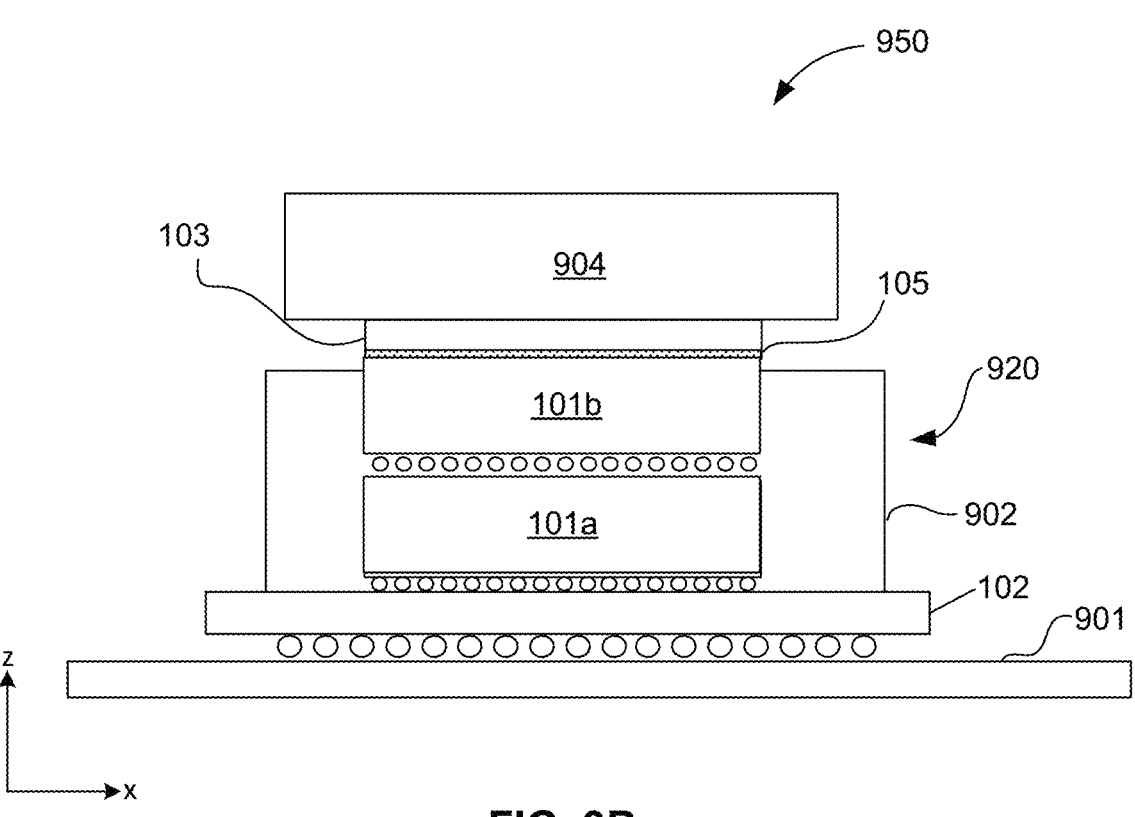
FIG. 9B illustrates a cross-sectional view in the x-z plane of an exemplary implementation comprising a multi-die package, according to some embodiments of the disclosure.

FIG. 9B illustrates a cross-sectional view in the x-z plane of exemplary implementation 950, comprising multi-die package 920, according to some embodiments of the disclosure.

In exemplary implementation embodiment 950, multi-die package 920 comprises a vertically integrated die stack, comprising dies 101a and 101b. Multi-die package 920 may be coupled to PCB 901, described above. In the illustrated embodiment, multi-die package 920 is surface mounted to PCB 901. In alternate embodiments, multi-die package 920 may be seated in a socket (not shown) mounted on PCB 901. Package 920 may include epoxy mold 902 encapsulating dies 101a and 101b, with DBM 103 on top of the stack, and attached to upper die 101b. DBM 103 may remain free of encapsulation material to contact heat sink 904. In some embodiments, heat sink 904 is a cold plate or a heat pipe.

Figure 10:
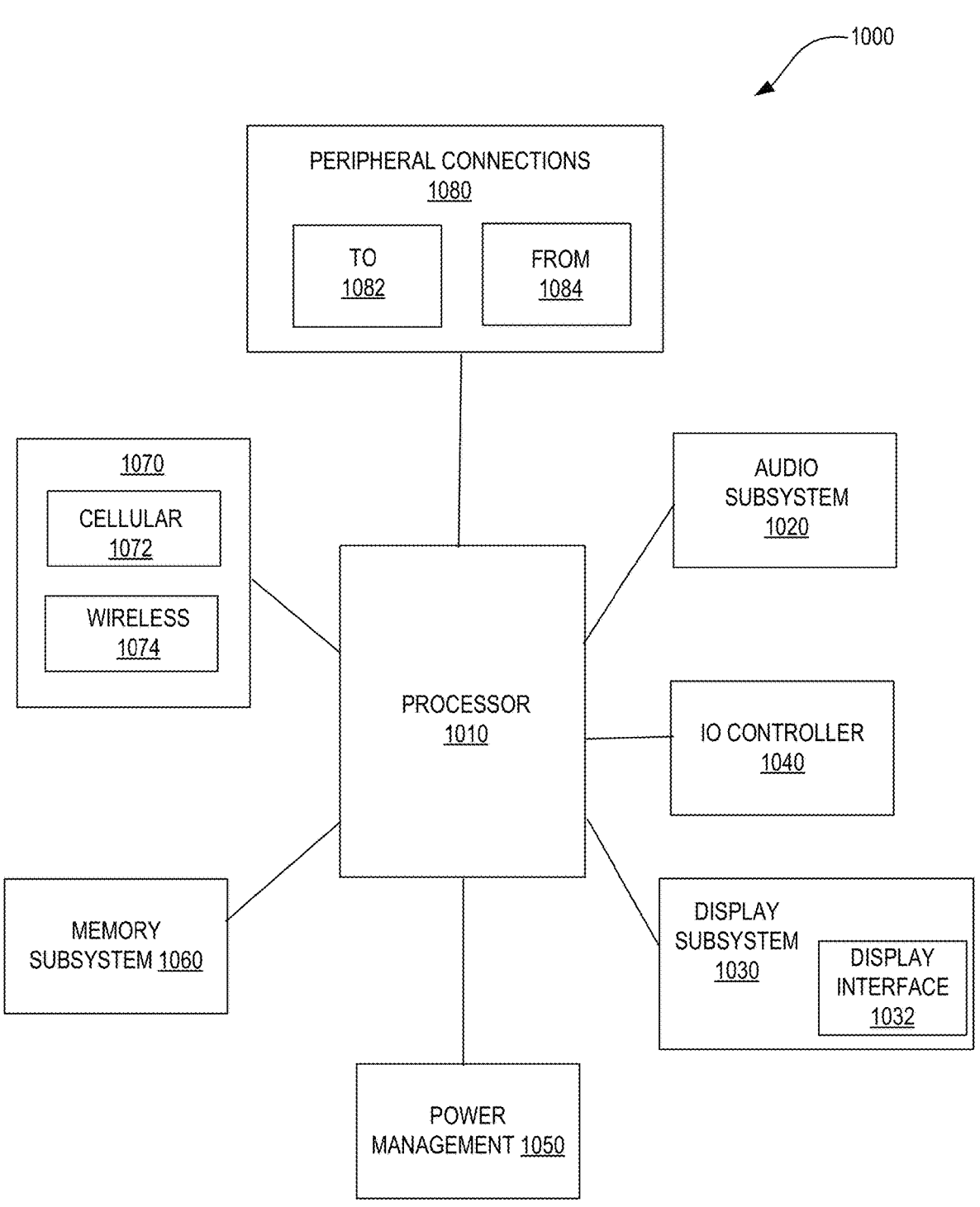
FIG. 10 illustrates a block diagram of a computing device as part of a system-on-chip (SoC) package in an implementation of IC packages comprising die backside metal (DBM) bonded to a die by a solder thermal interface material (STIM) according to some embodiments of the disclosure.

FIG. 10 illustrates a block diagram of computing device 1000 as part of a system-on-chip (SoC) package in an implementation of IC packages comprising die backside metal (DBM) bonded to a die by a solder thermal interface material (STIM) according to some embodiments of the disclosure.

According to some embodiments, computing device 1000 represents a server, a desktop workstation, or a mobile workstation, such as, but not limited to, a laptop computer, a computing tablet, a mobile phone or smart-phone, a wireless-enabled e-reader, or other wireless mobile device. CSP or multichip IC packages, such as, but not limited to, a single- or multi-core microprocessor (e.g., representing a central processing unit), logic dies, RF dies, high power dies, memory dies, antenna dies, comprises a packages substrate having, for example. Examples include package substrates 100 or 200, as disclosed herein.

In some embodiments, computing device has wireless connectivity (e.g., Bluetooth, WiFi and 5G network). It will be understood that certain components are shown generally, and not all components of such a device are shown in computing device 1000.

The various embodiments of the present disclosure may also comprise a network interface within 1070 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 1010 represents a CPU or a GPU, and can include one or more physical devices, such as microprocessors, application processors, microcontrollers, programmable logic devices, or other processing means. Processor 1010 may comprise a DBM (e.g., DBM 103 or 201) coupled to a die by a STIM (e.g., STIM 105 or 205) as disclosed. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010.

Display subsystem 1030 represents hardware (e.g., display devices) and software (e.g., drivers) components that provide a visual and/or tactile display for a user to interact with the computing device 1000. Display subsystem 1030 includes display interface 1032 which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMS, EPROMS, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Network interface 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) package, comprising a die having a front side and a back side, a thermal interface material (TIM) comprising a first metal over the backside, wherein the TIM has a thermal conductivity of not less than 40 W/mK; and a die backside material (DBM) comprising a second metal over the TIM, wherein the DBM has a CTE of not less than $18 \times 10^{-6}$ m/mK, wherein an interface between the TIM and the DBM comprises at least one intermetallic compound (IMC) of the first metal and the second metal.

Example 2 includes all of the features of example 1, wherein the first metal comprises any one of copper, indium, gallium, aluminum, silver or tin.

Example 3 includes all of the features of examples 1 or 2, wherein the second metal comprises any one of copper, zinc aluminum or nickel.

Example 4 includes all of the features of any one of examples 1 through 3, wherein the TIM comprises a plurality of filler particles embedded within the first metal, wherein the filler particles comprise any one of nickel, copper, silver, gold, cobalt or aluminum.

Example 5 includes all of the features of any one of examples 1 through 4, wherein the TIM extends a first distance from a first edge and a second edge, and wherein the DBM extends a second distance from a third edge and a fourth edge.

Example 6 includes all of the features of example 5, wherein the TIM extends a third distance between the first edge and the second edge, wherein the third distance is less than the first distance.

Example 7 includes all of the features of examples 5 or 6, wherein he TIM extends a fourth distance between the third edge and the fourth edge, wherein the fourth distance is less than the second distance.

Example 8 includes all of the features of any one of examples 5 through 7, wherein the DBM extends the first distance from the first edge to the second edge, and wherein the second metal extends the second distance from the third edge to the fourth edge.

Example 9 includes all of the features of any one of examples 5 through 8, wherein the DBM extends a fifth distance between the first edge and the second edge, wherein the fifth distance is less than the first distance.

Example 10 includes all of the features of any one of examples 1 through 9, wherein the DBM has a first z-height and the TIM has a second z-height less than the first z-height, wherein the first z-height is 500 microns or less, and the second z-height is 150 microns or less.

Example 11 includes all of the features of any one of examples 1 through 10, wherein the interface comprises any one of a first IMC comprising copper and indium, a second IMC comprising copper, indium and silver or a third IMC comprising copper, indium and tin.

Example 12 includes all of the features of example 11, wherein the interface comprises one layer comprising any of the first IMC, the second IMC or the third IMC, or the interface comprises at least two layers, wherein each of the at least two layers comprises any one of the first IMC, the second IMC or the third IMC.

Example 13 includes all of the features of any one of examples 1 through 12, wherein the die is vertically integrated in a die stack, wherein the die is an uppermost die on the die stack.

Example 14 is a system, comprising a microprocessor and a memory coupled to the microprocessor, the microprocessor or the memory comprising an integrated circuit (IC) package, comprising a die having a front side and a back side, a thermal interface material (TIM) comprising a first metal over the backside, wherein the TIM has a thermal conductivity of not less than 40 W/mK, and a die backside material (DBM) comprising a second metal over the TIM, wherein the DBM has a CTE of not less than $18 \times 10^{-6}$ m/mK, wherein an interface between the TIM and the DBM comprises at least one intermetallic compound (IMC) of the first metal and the second metal.

Example 15 includes all of the features of example 14, wherein the DBM is thermally coupled to a heat sink block, a heat pipe or a cold plate.

Example 16 is a method for making an IC package, comprising receiving a die having a front side and a backside, forming a bilayer metal structure over the backside of the die, wherein the bilayer metal structure comprises a metal sheet including a first metal layer bonded to second metal layer, wherein the first metal layer comprises a solder, and reflowing the solder, wherein the second metal layer is solder-bonded to the backside of the die.

Example 17 includes all of the features of example 16, wherein forming the bilayer metal structure over the die comprises placing a bilayer metal sheet over the backside of the die and reflowing the solder, wherein the first metal layer is solder-bonded to the backside of the die, and wherein the second metal layer has a CTE of 20 ppm/K or greater, and the first metal layer has a thermal conductivity of 40 W/mK or greater.

Example 18 includes all of the features of examples 16 or 17, wherein forming a bilayer metal structure comprises cladding the second metal layer to the first metal layer.

Example 19 includes all of the features of example 18, wherein cladding the second metal layer to the first metal layer comprises cold-rolling a sheet comprising the first metal layer over the second metal layer, wherein the first metal layer is compression bonded to the second metal layer.

Example 20 includes all of the features of examples 18 or 19, wherein cladding the second metal layer to the first metal layer comprises electroplating the first metal layer over the second metal layer or electroplating the second metal layer over the first metal layer.

Example 21 includes all of the features of any one of examples 16 through 20, wherein the second metal layer comprises copper, and the first metal layer comprises any one of indium, silver or tin.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package structure, comprising:

a die having a front side and a backside;

a first material comprising a first metal over the backside, wherein the first material comprises a plurality of filler particles embedded within the first metal; and a second material comprising a second metal over the first material, wherein an interface between the first material and the second material comprises at least one intermetallic compound (IMC) of the first metal and the second metal, and wherein the second material has a first z-height and the first material has a second z-height less than the first z-height, wherein the first z-height is 500 microns or less, and the second z-height is 150 microns or less.

2. The IC package structure of claim 1, wherein the first metal comprises copper, indium, gallium, aluminum, silver, or tin, or wherein the second metal comprises copper, zinc, aluminum, or nickel.

3. The IC package structure of claim 1, wherein the filler particles comprise nickel, copper, silver, gold, cobalt, or aluminum.

4. The IC package structure of claim 1, wherein the first material and the second material both cover substantially all of the backside of the die, or the first material is within a recess of the second material.

5. The IC package structure of claim 1, wherein a second interface between the first material and a third material comprises a second IMC.

6. The IC package structure of claim 1, wherein the first material has a thermal conductivity of not less than 40 W/mK and wherein the second material has a coefficient of thermal expansion (CTE) of not less than $18 \times 10^{-6}$ m/mK.

7. The IC package structure of claim 1, further comprising:
   a package substrate coupled to the die; and
   a board coupled to the package substrate.

8. An integrated circuit (IC) package structure, comprising:
   a die having a front side and a backside;
   a first material comprising a first metal over the backside, wherein the first material has a thermal conductivity of not less than 40 W/mK;
   a second material comprising a second metal over the first material, wherein the second material has a coefficient of thermal expansion (CTE) of not less than $18 \times 10^{-6}$ m/mK; and
   a third material over the second material, wherein a first interface between the first material and the second material comprises a first intermetallic compound (IMC) of the first metal and the second metal, and wherein a second interface between the first material and the third material comprises a second IMC.

9. The IC package structure of claim 8, wherein the first metal comprises copper, indium, gallium, aluminum, silver, or tin, or wherein the second metal comprises copper, zinc, aluminum, or nickel.

10. The IC package structure of claim 8, wherein the first material comprises a plurality of filler particles embedded within the first metal.

11. The IC package structure of claim 8, wherein the first material and the second material both cover substantially all of the backside of the die, or the first material is within a recess of the second material.

12. The IC package structure of claim 8, wherein the second material has a first z-height and the first material has a second z-height less than the first z-height, the first z-height is 500 microns or less, and the second z-height is 150 microns or less.

13. The IC package structure of claim 8, further comprising:
   a package substrate coupled to the die; and
   a board coupled to the package substrate.

14. An integrated circuit (IC) package structure, comprising:
   a die having a front side and a backside;
   a first material comprising a first metal over the backside, wherein the first material comprises a plurality of filler particles embedded within the first metal;
   a second material comprising a second metal over the first material; and
   a third material over the second material, wherein an interface between the first material and the second material comprises a first intermetallic compound (IMC) of the first metal and the second metal, and wherein a second interface between the first material and the third material comprises a second IMC.

15. The IC package structure of claim 14, wherein the first metal comprises copper, indium, gallium, aluminum, silver, or tin, or wherein the second metal comprises copper, zinc, aluminum, or nickel.

16. The IC package structure of claim 14, wherein the filler particles comprise nickel, copper, silver, gold, cobalt, or aluminum.

17. The IC package structure of claim 14, wherein the first material and the second material both cover substantially all of the backside of the die, or the first material is within a recess of the second material.

18. The IC package structure of claim 14, wherein the second material has a first z-height and the first material has a second z-height less than the first z-height.

19. The IC package structure of claim 18, wherein the first z-height is 500 microns or less, and the second z-height is 150 microns or less.

20. The IC package structure of claim 14, wherein the first material has a thermal conductivity of not less than 40 W/mK.

21. The IC package structure of claim 14, wherein the second material has a coefficient of thermal expansion (CTE) of not less than $18 \times 10^{-6}$ m/mK.

22. The IC package structure of claim 14, further comprising:
   a package substrate coupled to the die; and
   a board coupled to the package substrate.

* * * * *